(12) United States Patent
Ha et al.

(10) Patent No.: US 7,538,046 B2
(45) Date of Patent: *May 26, 2009

(54) METHOD OF CLEANING SEMICONDUCTOR DEVICE FABRICATION APPARATUS

(75) Inventors: In-su Ha, Yongin-si (KR); Yoon-bon Koo, Suwon-si (KR); Hyun-seok Lim, Suwon-si (KR); Cheon-su Han, Seoul (KR); Seung-cheol Choi, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 2 days.

This patent is subject to a terminal disclaimer.

(21) Appl. No.: 11/583,049

(22) Filed: Oct. 19, 2006

(65) Prior Publication Data

US 2007/0037407 A1    Feb. 15, 2007

Related U.S. Application Data

(63) Continuation of application No. 10/999,183, filed on Nov. 30, 2004, now Pat. No. 7,141,512.

(30) Foreign Application Priority Data

Dec. 11, 2003   (KR)  ............................ 2003-0090202

(51) Int. Cl.
  *H01L 21/31*  (2006.01)
  *H01L 21/469*  (2006.01)
(52) U.S. Cl. .................. 438/785; 438/656; 257/E21.21
(58) Field of Classification Search ................. 438/768, 438/785, 656, 720, 905; 118/70; 257/E21.21
See application file for complete search history.

(56) References Cited

U.S. PATENT DOCUMENTS

| 4,306,887 A | 12/1981 | Barosi et al. |
| 5,610,106 A | 3/1997 | Foster et al. |

(Continued)

FOREIGN PATENT DOCUMENTS

| DE | 10226381 A1 | 1/2003 |
| JP | 2003-203907 | 7/2003 |
| JP | 2003203907 | 7/2003 |
| KR | 2003-0071582 | 9/2003 |

OTHER PUBLICATIONS

Translation of Office Action issued by German Patent and Trademark Office Jun. 30, 2006.

*Primary Examiner*—Caridad M Everhart
(74) *Attorney, Agent, or Firm*—Volentine & Whitt, PLLC

(57) ABSTRACT

A semiconductor device fabrication apparatus is cleaned after a conductive layer is formed on a metal oxide layer of a substrate. The substrate is disposed on a heater in a process chamber of the apparatus, and the conductive layer is formed by introducing source gases into the chamber. Then the substrate is transferred out of the process chamber. At least one by-product of a reaction between the source gases and the metal oxide layer adheres to a surface inside the chamber, such as to a region or regions of the heater. Once the semiconductor substrate has been transferred outside the process chamber of the semiconductor fabrication apparatus, the by-product(s) is/are removed by evaporation. The by-product(s) can be evaporated using gas, such as one of the source gases, so that the process chamber can remain closed.

11 Claims, 21 Drawing Sheets

U.S. PATENT DOCUMENTS

| | | | |
|---|---|---|---|
| 5,954,887 A * | 9/1999 | Hatano | 134/2 |
| 6,165,328 A | 12/2000 | Lorimer et al. | |
| 6,395,100 B1 | 5/2002 | Brennan et al. | |
| 6,419,986 B1 | 7/2002 | Holtermann et al. | |
| 6,617,209 B1 * | 9/2003 | Chau et al. | 438/240 |
| 7,141,512 B2 * | 11/2006 | Ha et al. | 438/768 |
| 2004/0099215 A1 * | 5/2004 | Danek et al. | 118/723 E |
| 2005/0169766 A1 | 8/2005 | Gallitognotta et al. | |

* cited by examiner

US 7,538,046 B2

METHOD OF CLEANING SEMICONDUCTOR DEVICE FABRICATION APPARATUS

CROSS-REFERENCE TO RELATED APPLICATION

This is a continuation of, and a claim of priority is made to, U.S. non-provisional application Ser. No. 10/999,183, filed Nov. 30, 2004, now U.S. Pat. No. 7,141,512 the entirety of which is incorporated herein by reference.

BACKGROUND OF THE INVENTION

1. Field of the Invention

The present invention relates to a method of cleaning a semiconductor device fabrication apparatus. More particularly, the present invention relates to a method of cleaning the interior of a semiconductor device fabrication apparatus of by-products produced as the result of forming a conductive layer on a semiconductor substrate.

2. Description of the Related Art

Recently, due to the rapid development of information communication technology and the widespread use of data storage media, such as computers, demands have increased for semiconductor devices that operate faster and have a larger data storage capacity. Accordingly, there is a growing trend to improve semiconductor device fabrication technology with the aim of increasing the integration density, reliability and response speed of the devices.

In general, a semiconductor device can be made more highly integrated if a dielectric material formed on a semiconductor substrate of the device can be made thinner. However, semiconductor devices become more susceptible to leakage current the thinner the dielectric material becomes. Accordingly, a thin dielectric layer may compromise the operational reliability of the semiconductor device.

Metal oxides, e.g., $Al_2O_3$, are typically employed as dielectric materials of semiconductor devices. Research into metal oxides having a high dielectric constant is actively under way to provide a solution to the leakage current problem. Specifically, attempts are being made to use a Zr oxide or an Hf oxide as a dielectric material capable of allowing highly integrated semiconductor devices to operate in a reliable manner.

However, the use of a Zr oxide or an Hf oxide as a dielectric material of a semiconductor device presents several problems. These will now be described more fully with reference to FIGS. 1A through 1D. In a conventional semiconductor device fabrication apparatus, as shown in FIG. 1A, a semiconductor substrate 2 having an Hf oxide ($HfO_2$) layer is disposed on a heater 1, and a conductive layer, e.g., a TiN layer, is formed on the $HfO_2$ layer using $NH_3$ and $TiCl_4$ as source gases. Referring to FIG. 1B, although the semiconductor substrate 2 is then transferred outside the apparatus, oxygen components remain on a region of the heater 1 where they react with the source gases or Hf ions remaining in the apparatus. As a result, a byproduct layer 3 containing HfN and an Hf oxide is undesirably formed on the heater 1. Likewise, in the case of forming a conductive layer, e.g., a TiN layer, on a Zr oxide ($ZrO_2$) layer using $NH_3$ and $TiCl_4$ as source gases, a layer of byproduct containing ZrN and Zr oxide is formed on the heater 1.

As shown in FIG. 1C, the process of forming a conductive layer on a semiconductor substrate 2 having an Hf oxide or a Zr oxide is repeated Consequently, the thickness of the layer 3 comprising HfN and an Hf oxide (or ZrN and a Zr oxide) increases on the region of the heater 1 dedicated to support the semiconductor substrate 2.

Japanese Patent Laid-open Publication No. 2003-203907 suggests using a chemical vapor deposition (CVD)-based cleaning process to remove the byproduct layer 3 from the heater 1. However, practice has shown that CVD cannot completely remove the layer 3. Furthermore, removing the byproduct layer 3 involves opening the semiconductor device fabrication apparatus periodically. This results in downtime that decreases the productivity of the semiconductor device fabrication process.

SUMMARY OF THE INVENTION

An object of the present invention is to provide a method of effectively cleaning an interior surface of a semiconductor device fabrication apparatus of by-products produced as the result of a fabrication process in which a conductive layer is formed on a semiconductor substrate having a metal oxide layer.

According to one aspect of the present invention, a method for use in the fabrication of semiconductor devices comprises removing at least one by-product from an interior surface of the apparatus without opening the processing chamber of the apparatus after each time a conductive layer has been formed on a metal oxide layer of a substrate within the chamber.

First, a semiconductor substrate having a metal oxide layer is situated in the processing chamber of the semiconductor device fabrication apparatus. Subsequently, the conductive layer is formed on the metal oxide layer by introducing source gases into the chamber. The substrate is transferred out of the processing chamber after the conductive layer has been formed on the metal oxide layer. The source gases, though, facilitate a reaction with the metal oxide layer wherein a by-product of the reaction adheres to an interior surface of the apparatus, such as to a heater of the apparatus on which the substrate is supported. These steps are carried out a number of times such as occurs when processing numerous substrates.

After each time that a conductive layer has been formed on a metal oxide layer of a substrate in the processing chamber, and once that substrate has then been transferred outside the processing chamber, the by-products of the reaction are removed from the surface of the apparatus without opening the processing chamber.

According to another aspect of the present invention, the by-products are removed by evaporating them. Preferably, the evaporating of the by-products is carried out using one of the source gases.

According to still another aspect of the present invention, the other source gas is then once again introduced into the processing chamber. Thus, the cleaning process not only removes the by-products but also forms a conductive layer on the surface of the heater. Once the conductive layer on the surface of the heater becomes so thick as to adversely influence the forming of a conductive, it is removed.

Another object of the present invention is to provide a method of effectively cleaning a heater of a semiconductor device fabrication apparatus of by-products produced as the result of a fabrication process in which a conductive layer is formed on a semiconductor substrate having a metal oxide layer of Hf oxide or Zr oxide.

The semiconductor substrate is supported on a dedicated region of the heater in the processing chamber of the apparatus. Subsequently, a conductive layer of TiN is formed on the metal oxide layer by introducing source gases of $NH_3$ and $TiCl_4$ into the processing chamber. Then, the substrate is transferred out of the processing chamber. Subsequently, by-products are evaporated off of the heater by heating the heater and introducing an additional supply of the $TiCl_4$ into the processing chamber.

BRIEF DESCRIPTION OF THE DRAWINGS

The above and other features and advantages of the present invention will become more apparent from the following detailed description of the preferred embodiments thereof made with reference to the attached drawings in which.

DETAILED DESCRIPTION OF THE PREFERRED EMBODIMENTS

A first embodiment of a method of cleaning a semiconductor device fabrication apparatus according to a the present invention will now be described in greater detail with reference to FIGS. 2 and 3A through 3F.

First, $NH_3$ gas and $TiCl_4$ gas are directed towards the entire surface of a heater 11 inside a processing chamber of the semiconductor device fabrication apparatus, and a TiN layer 125 is formed on the surface before a semiconductor substrate 12 having a metal oxide layer is transferred into the processing chamber of the apparatus (step S11). This makes it possible to provide processing conditions that ultimately facilitate the forming of a TiN layer 125 on the semiconductor substrate 12 during a subsequent step (step S12).

Figure 1A:
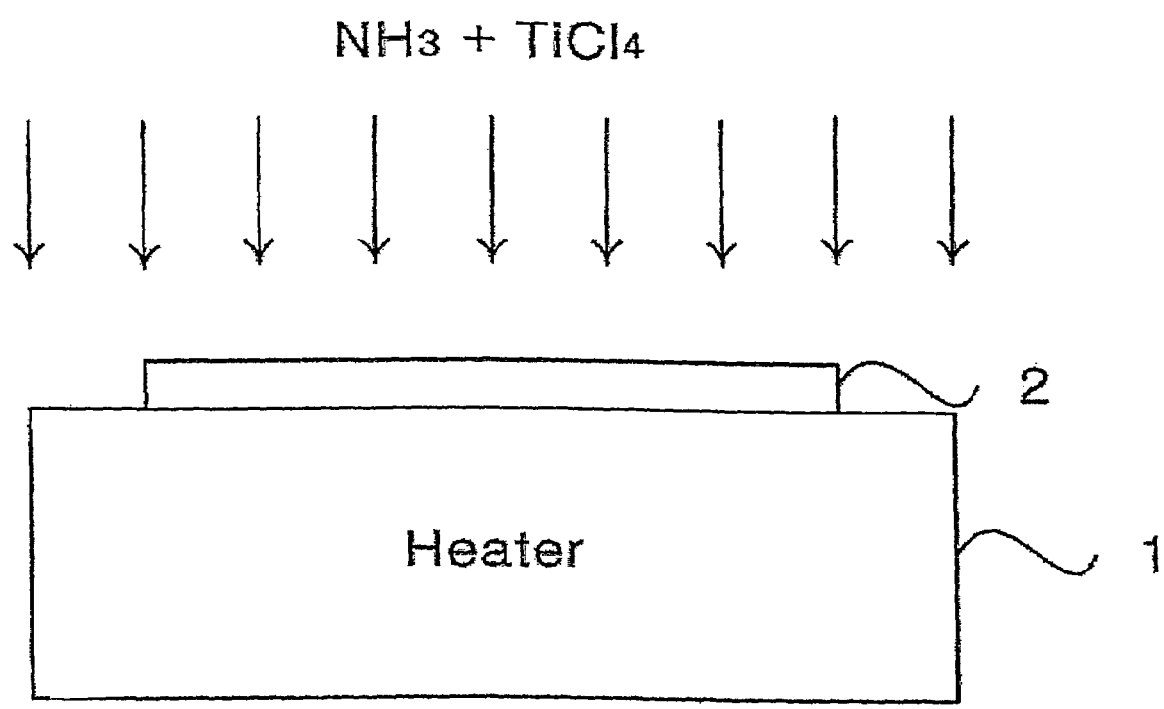
FIGS. 1A through 1D are cross-sectional views of the inside of a conventional semiconductor device fabrication apparatus illustrating a method of forming a conductive layer on a semiconductor substrate having a metal oxide layer.
Figure 1B:
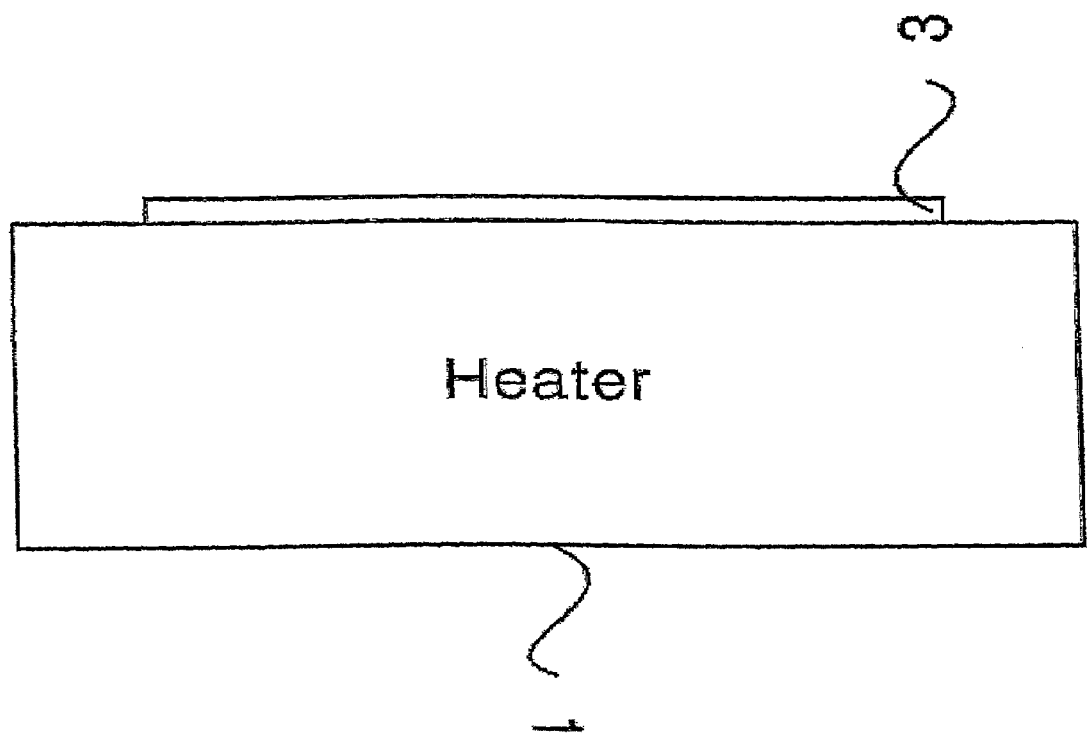
Figure 1C:
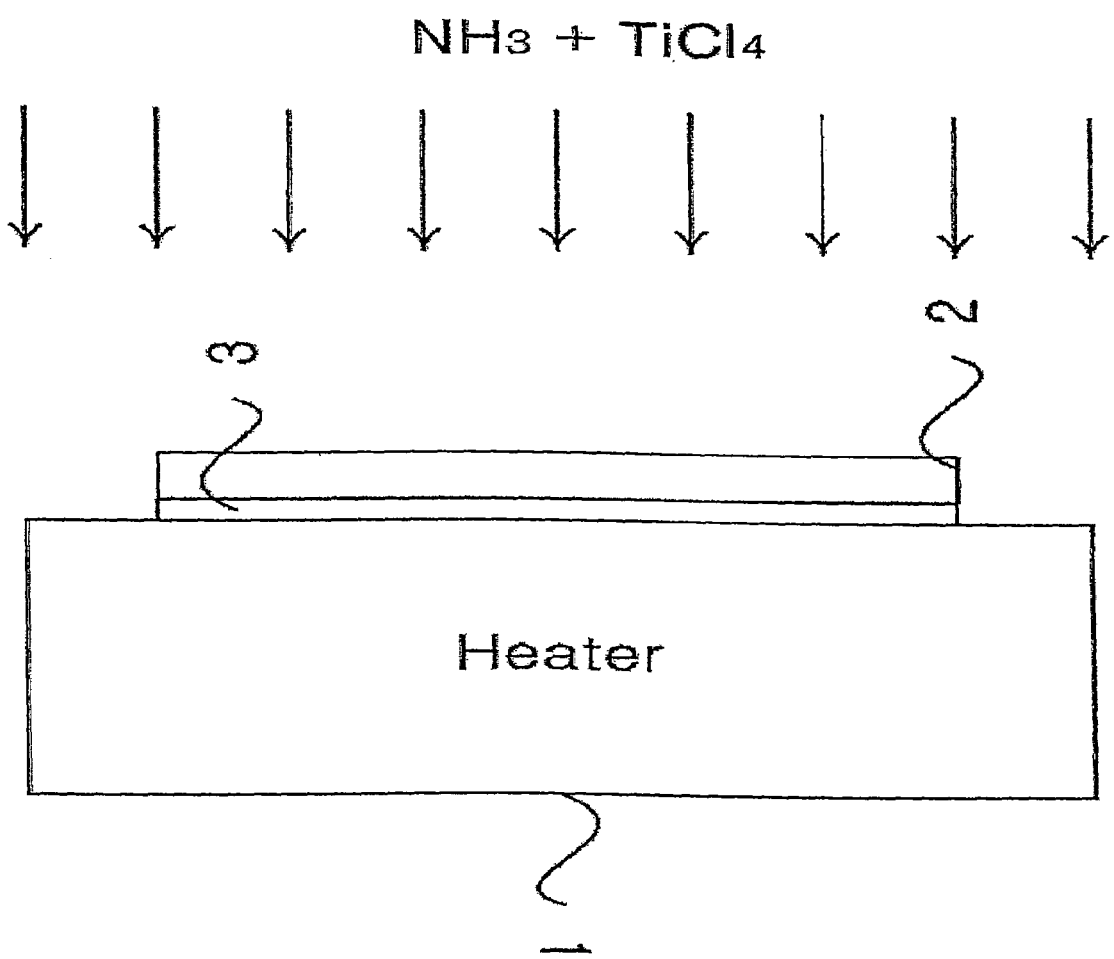
Figure 1D:
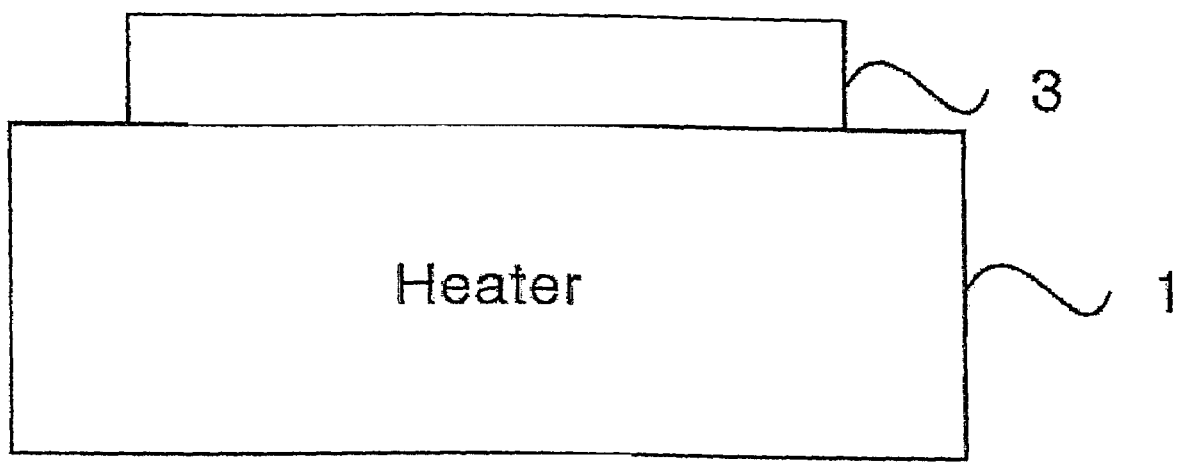
Figure 2:
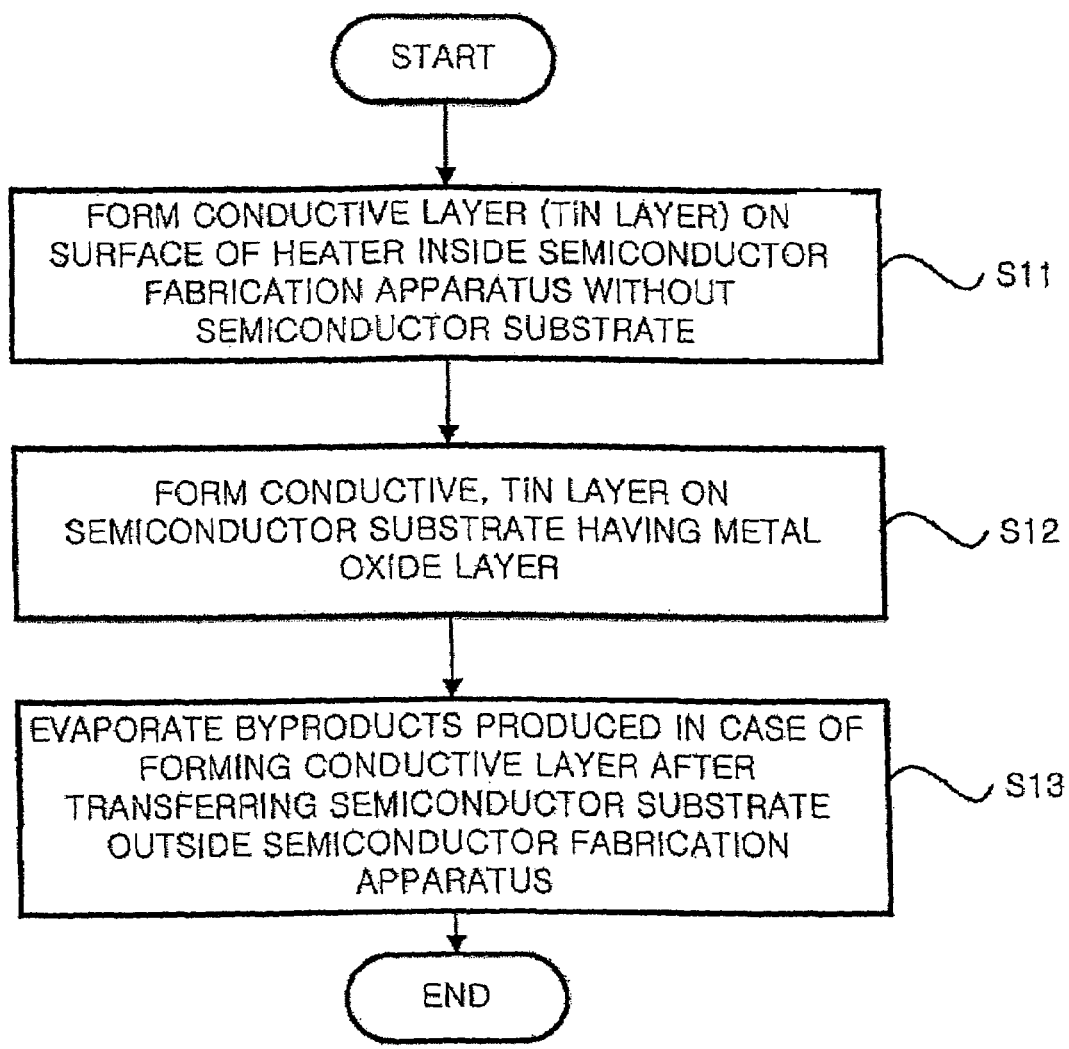
FIG. 2 is a flowchart of a first embodiment of a method of cleaning a semiconductor device fabrication apparatus according to the present invention.
Figure 3A:
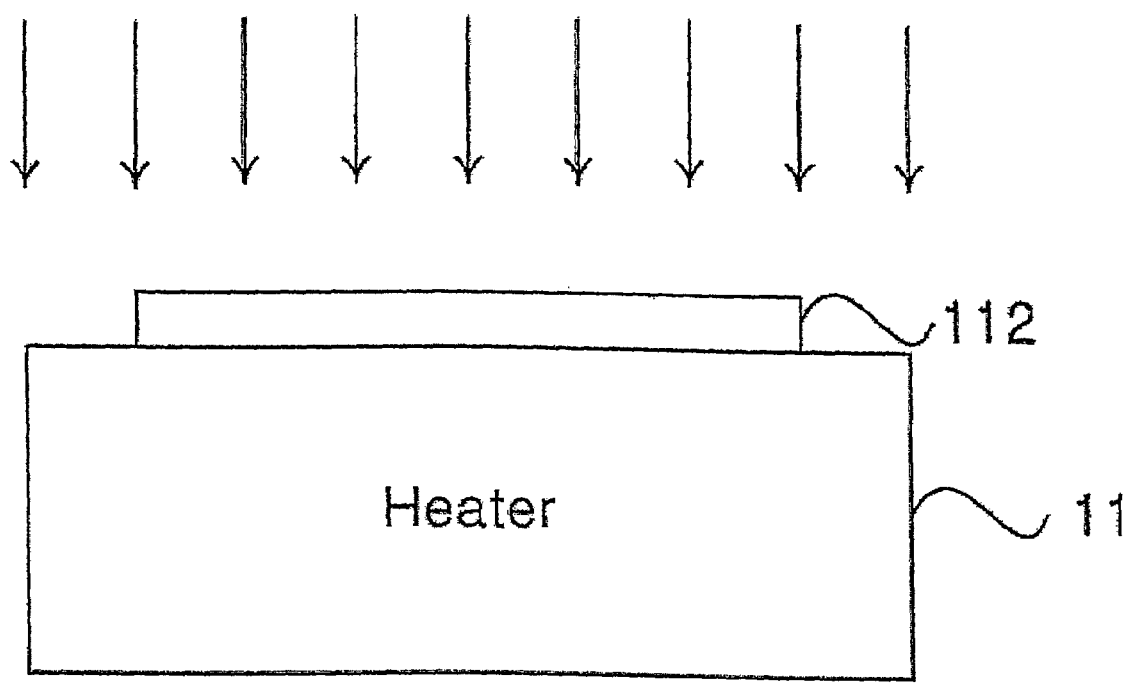
FIGS. 3A through 3F are cross-sectional views of the inside of a conventional semiconductor device fabrication apparatus illustrating the first embodiment of the method of cleaning the apparatus according to the present invention.
Figure 3B:
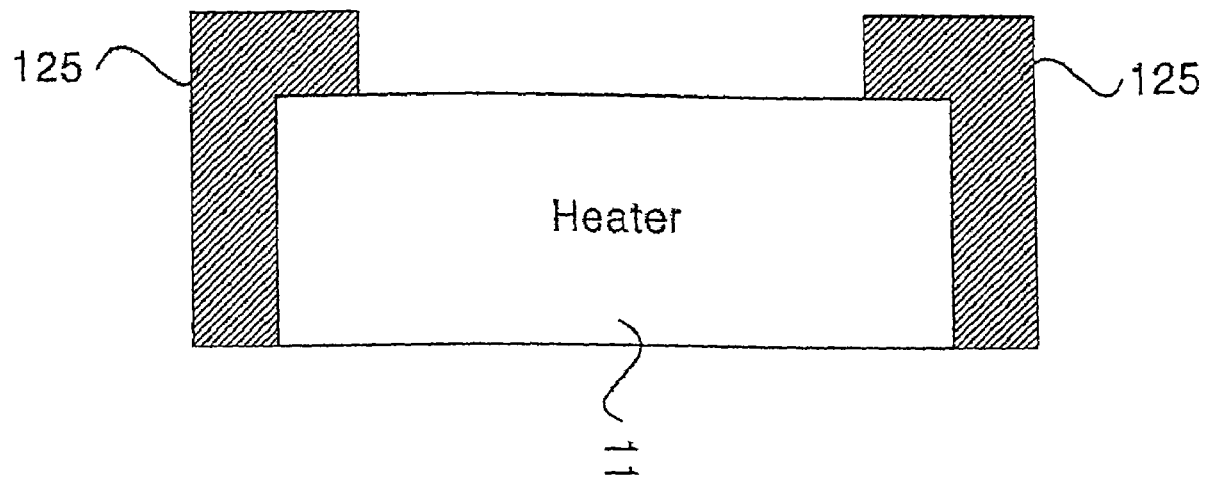
Figure 3C:
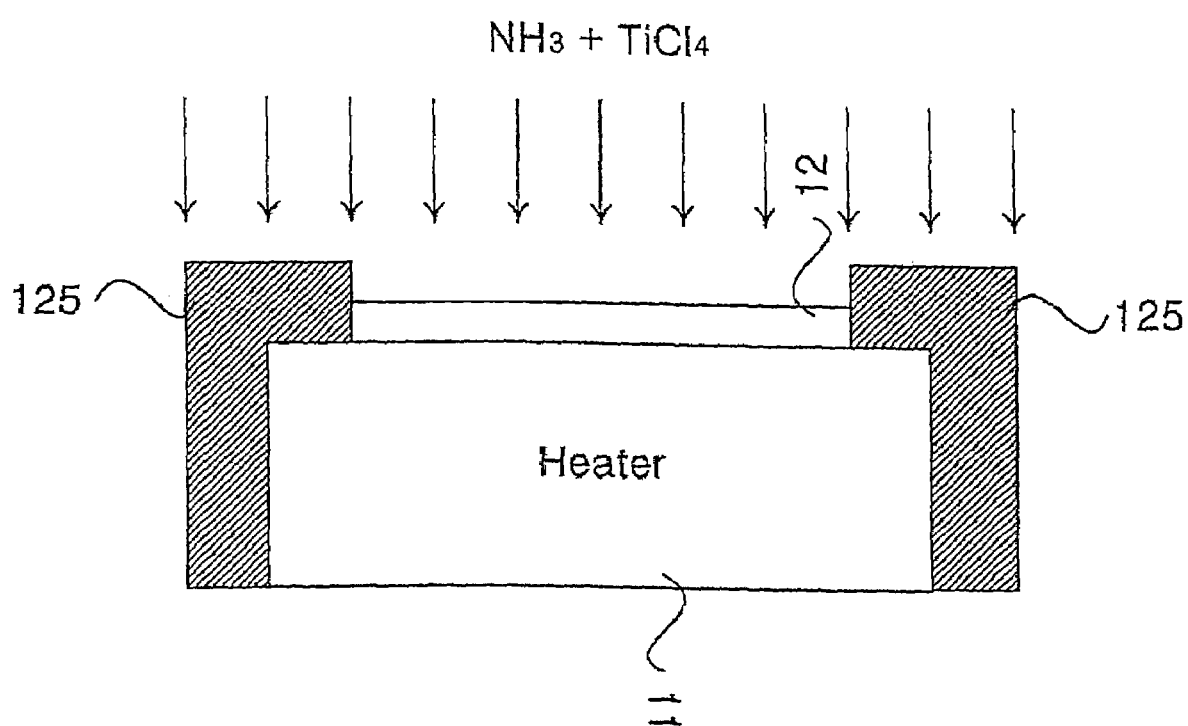

The TiN layer 125 is preferably formed on the entire surface of the heater 11 other than the region that is to be occupied by the semiconductor substrate 12, as shown in FIG. 3B. To this end, a dummy semiconductor substrate 112 is placed on the region dedicated to support the semiconductor substrate 12, and $NH_3$ gas and $TiCl_4$ gas are then directed towards the entire surface of the heater 11, as shown in FIG. 3C.

Next, as mentioned above, a semiconductor substrate 12 is transferred into the processing chamber of the semiconductor device fabrication apparatus. A metal oxide layer having a high dielectric constant, e.g., a layer of $HfO_2$ or $ZrO_2$ is formed on the substrate 12. The Hf oxide layer is formed using tetrakis ethylmethylaino hafnium (TEMAH: $Hf[N(CH_3)C_2H_5]_4$) or hafnium tert-butoxide ($Hf[OC(CH_3)_3]_4$) as a source gas, whereas the Zr oxide layer is formed using tetrakis ethylmethylaino zirconium (TEMAZ: $Zr[N(CH_3)C_2H_5]_4$) or zirconium tert-butoxide ($Zr[OC(CH_3)_3]_4$) as a source gas.

Then a conductive layer, e.g., a layer of TiN, is formed on the metal oxide layer (step S12). The TiN layer is formed using $NH_3$ and $TiCl_4$ as source gases. To this end, as shown in FIG. 3C, the semiconductor substrate 12 is placed on the heater 11 inside the processing chamber of the semiconductor device fabrication apparatus where the substrate is heated to 600° C., and $NH_3$ gas and $TiCl_4$ gas are introduced into the processing chamber.

Figure 3D:
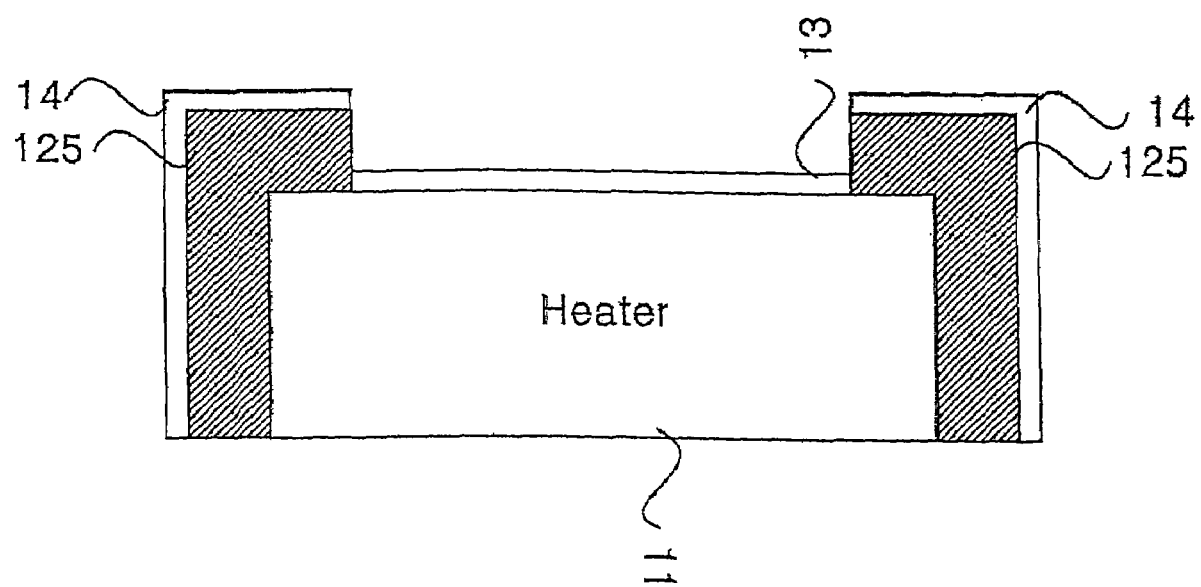

When the metal oxide layer contains an Hf oxide, the Hf component of the oxide reacts with $NH_3$, thus forming HfN, and reacts with $TiCl_4$, thus forming $HfCl_4$. In this case, the $HfCl_4$ exists in a gaseous state whereas the HfN exists in a solid state. As shown in FIG. 3D, a by-product layer 14 comprising HfN is thus formed on a region of the heater 11 not occupied by the semiconductor substrate 12.

Once the semiconductor substrate 12 is moved off of the heater 11 in the course of its being transferred outside the processing chamber of the semiconductor device fabrication apparatus, oxygen remaining on the heater 11 reacts with Hf components that remain inside the processing chamber, thus forming an Hf oxide. In addition, the Hf components that remain inside the chamber react with $NH_3$, thus forming HfN. As a result, a by-product layer 13 comprising an Hf oxide and HfN is formed on the region of the heater 11 that used to be occupied by the substrate 12.

When the metal oxide layer comprises a Zr oxide, a first by-product layer 13 comprising a Zr oxide and ZrN is formed on the region of the heater 11 that used to be occupied by the semiconductor substrate 12, and a second by-product layer 14 comprising ZrN is formed on the conductive layer 125 over the surface of the heater 11 outside the region occupied by the semiconductor substrate 12.

Finally (step S13), at least one by-product formed as the result of the process described above is evaporated.

Figure 3E:
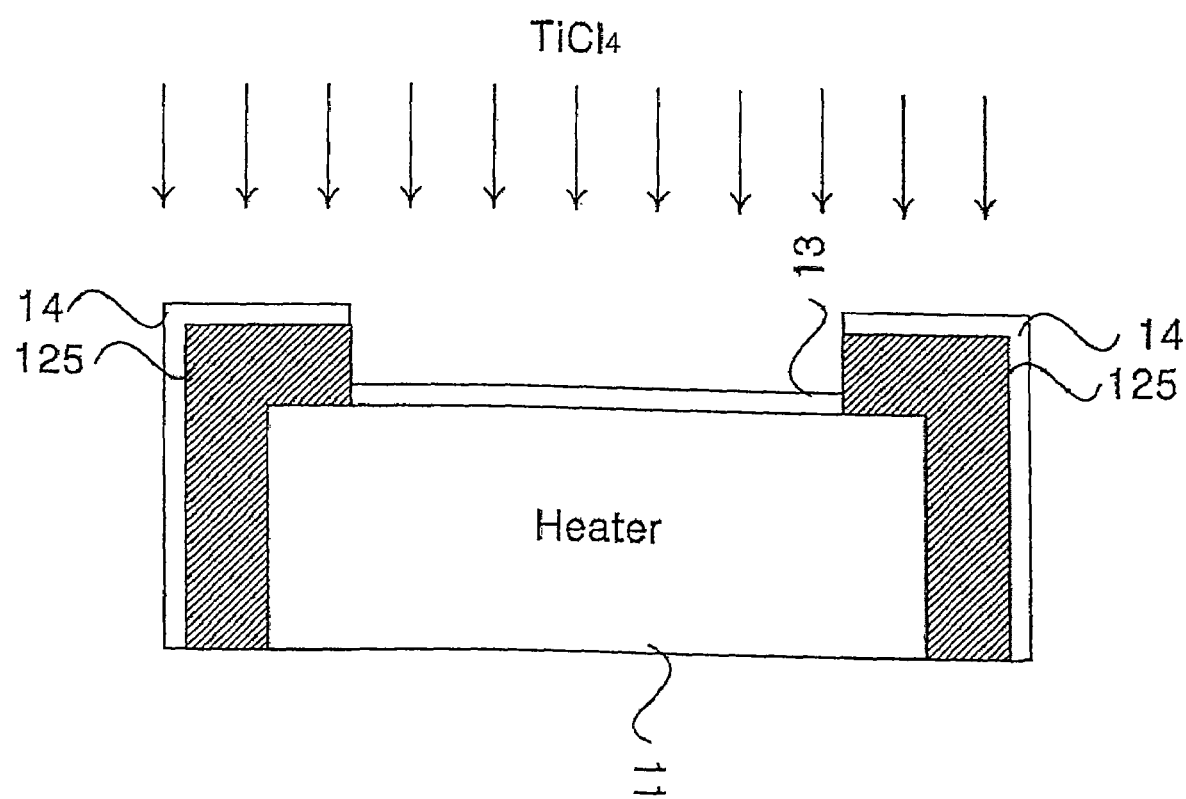
Figure 3F:
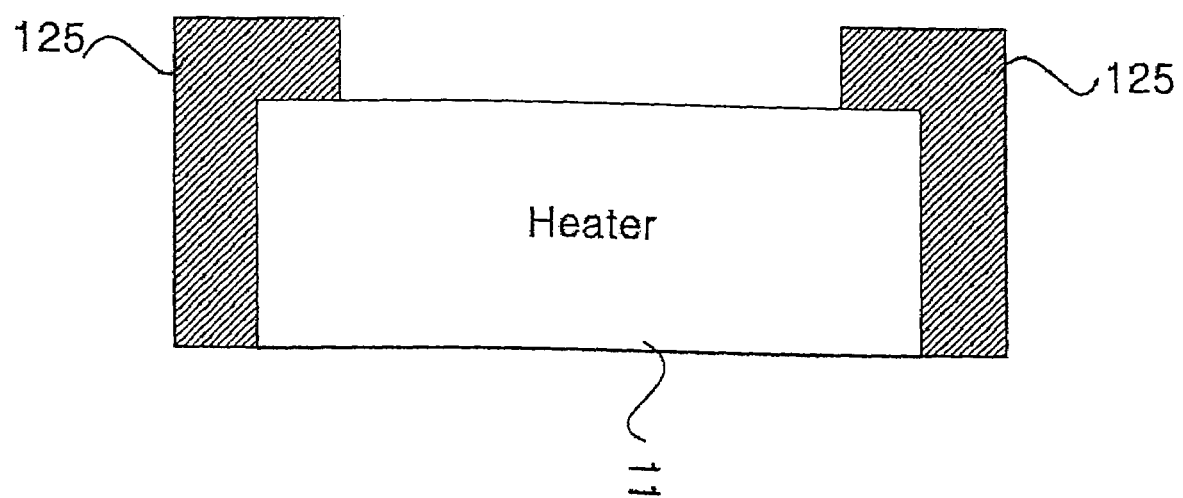
Figure 4:
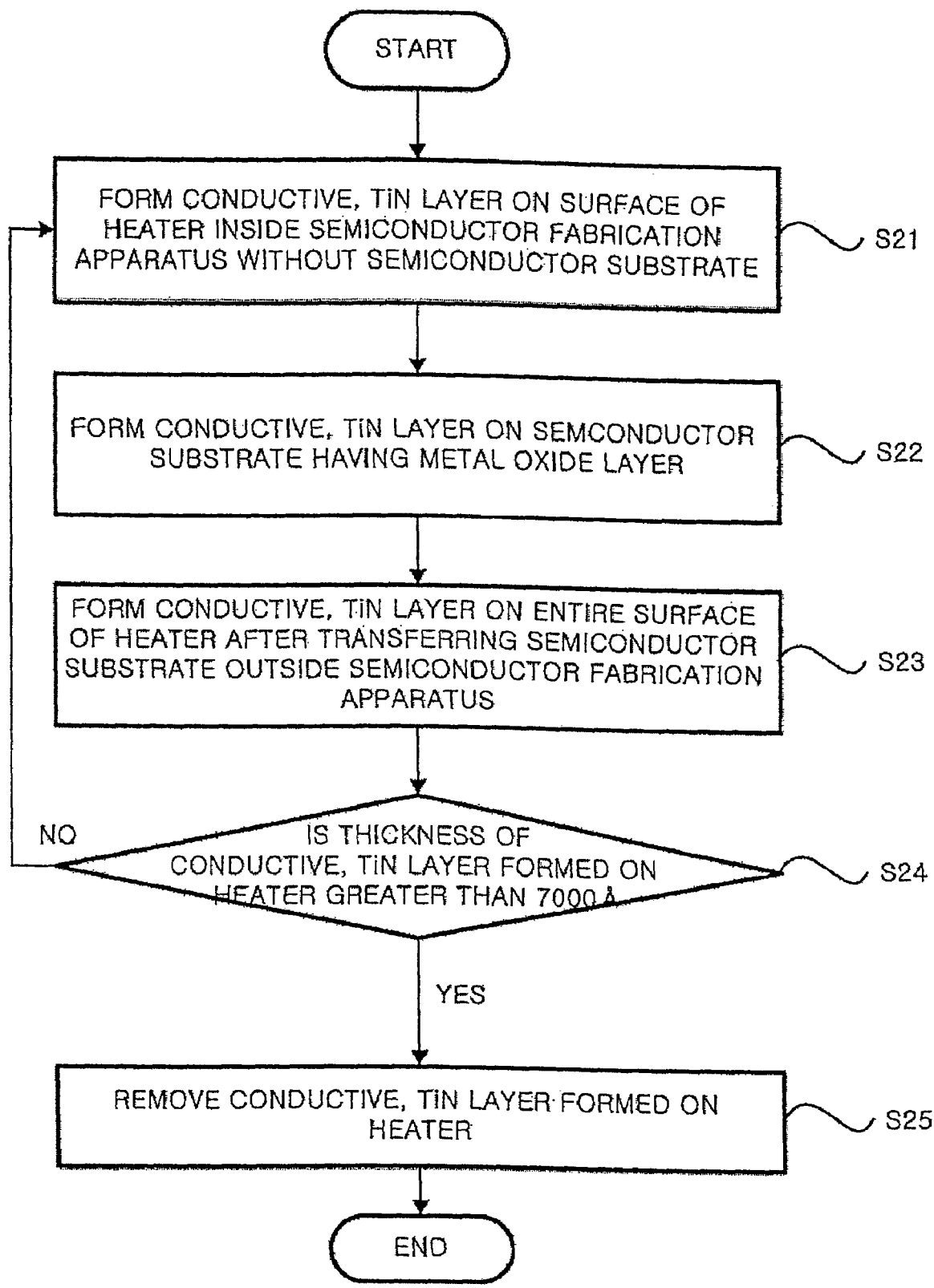
FIG. 4 is a flowchart of a second embodiment of a method of cleaning a semiconductor device fabrication apparatus according to the present invention.

When the metal oxide layer comprises an Hf oxide, the Hf oxide and HfN of the first and second by-product layers 13 and 14 can be evaporated using $TiCl_4$. That is, as shown in FIG. 3E, $TiCl_4$ is introduced into the semiconductor fabrication apparatus with the heater 11 heated to 600° C. The $TiCl_4$ reacts with the Hf oxide, thus forming $HfCl_4$, and further reacts with HfN, thus also forming $HfCl_4$. The $HfCl_4$ is gaseous and so, the first and second by-product layers 13 and 14 are removed as shown in FIG. 3F.

When the metal oxide layer comprises a Zr oxide, the Zr oxide and ZrN of the first and second by-product layers 13 and 14 can also be evaporated using $TiCl_4$. Specifically, $TiCl_4$ reacts with the Zr oxide, thus forming $ZrCl_4$ and also reacts with ZrN, thus also forming $ZrCl_4$. The $ZrCl_4$ is gaseous and so, the first and second by-product layers 13 and 14 are removed.

As mentioned above, $TiCl_4$ is used as a source gas in the process of forming the TiN layer. Accordingly, it is not necessary to provide a separate source of gas for removing the first and second by-product layers 13 and 14.

The evaporating (step S13) is preferably performed whenever a TiN layer (step S12) is formed on a substrate 12. If the evaporating were not performed until several TiN layers have been formed, so much of the by-products would accumulate that they could not be sufficiently removed. Moreover, forming a TiN layer in the presence of the first by-product layer 13 could adversely affect the characteristics of the TiN layer, thereby affecting the uniformity of the products produced by semiconductor device fabrication process.

Hereinafter, a second embodiment of a method of cleaning a semiconductor device fabrication apparatus according to the present invention will be described in greater detail with reference to FIGS. 4 and 5A through 5I. In the following, some aspects of the second embodiment that are the same as those of the first embodiment will not be described in detail for the sake of brevity.

First (step S21), a conductive layer 225 is formed on the heater 21 in the processing chamber of a semiconductor device fabrication apparatus before a semiconductor substrate 22 having a metal oxide layer is transferred into the processing chamber. The metal oxide layer comprises a metal oxide having a high dielectric constant, e.g., an Hf oxide ($HfO_2$) or a Zr oxide ($ZrO_2$), and the conductive layer comprises a conductive material, e.g., TiN.

More specifically, $NH_3$ gas and $TiCl_4$ gas are introduced into the processing chamber of the semiconductor device fabrication device apparatus before the semiconductor substrate 22. This makes it possible to provide processing conditions that ultimately facilitate the forming of the TiN layer 225 on the semiconductor substrate 22 in a subsequent step.

Figure 5A:
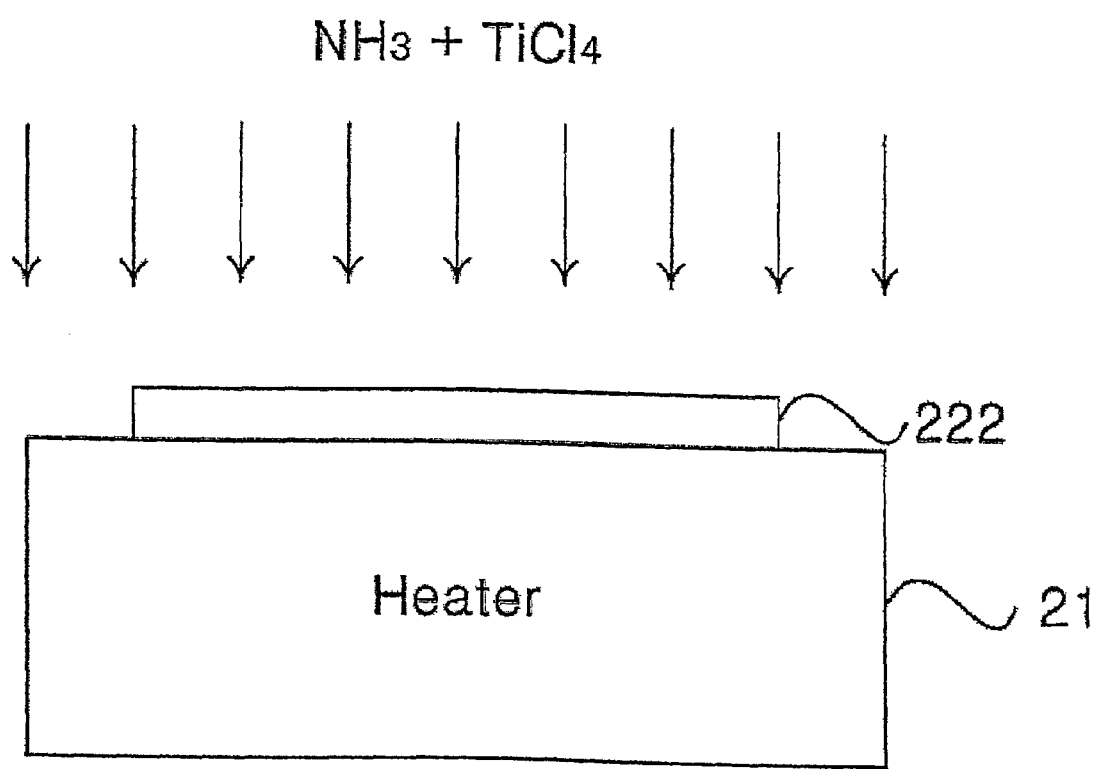
FIGS. 5A through 5I are cross-sectional views of the inside of a conventional semiconductor device fabrication apparatus illustrating the second embodiment of the method of cleaning the apparatus according to the present invention.
Figure 5B:
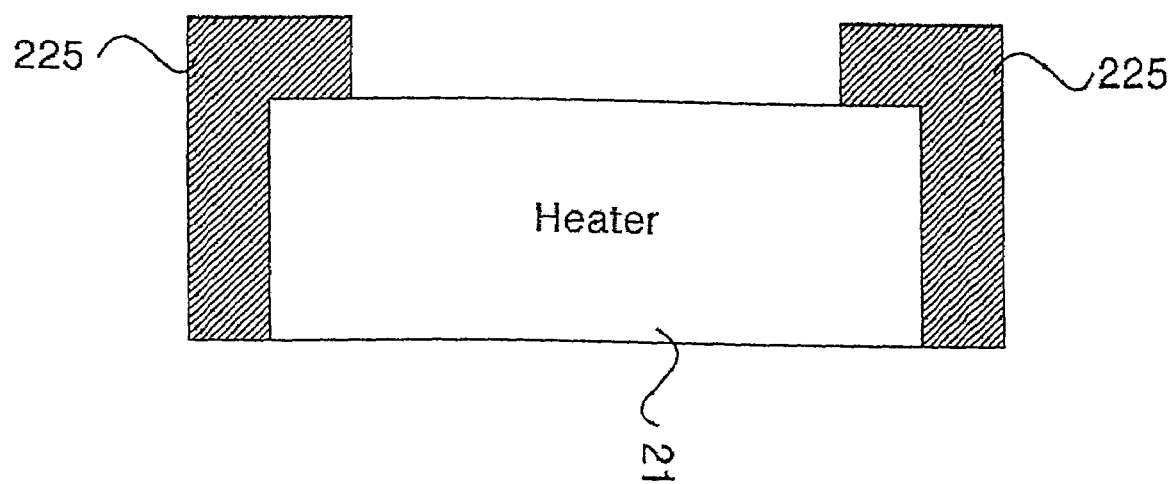

Preferably, the conductive layer 225 is formed on the entire surface of the heater 21 other than the region that will be occupied by the semiconductor substrate 22, as shown in FIG. 5B. To this end, a dummy semiconductor substrate 222 is placed on the region of the heater 21 dedicated to support the semiconductor substrate 22, and $NH_3$ gas and $TiCl_4$ gas are then directed towards the entire surface of the heater 21, as shown in FIG. 5A.

Figure 5C:
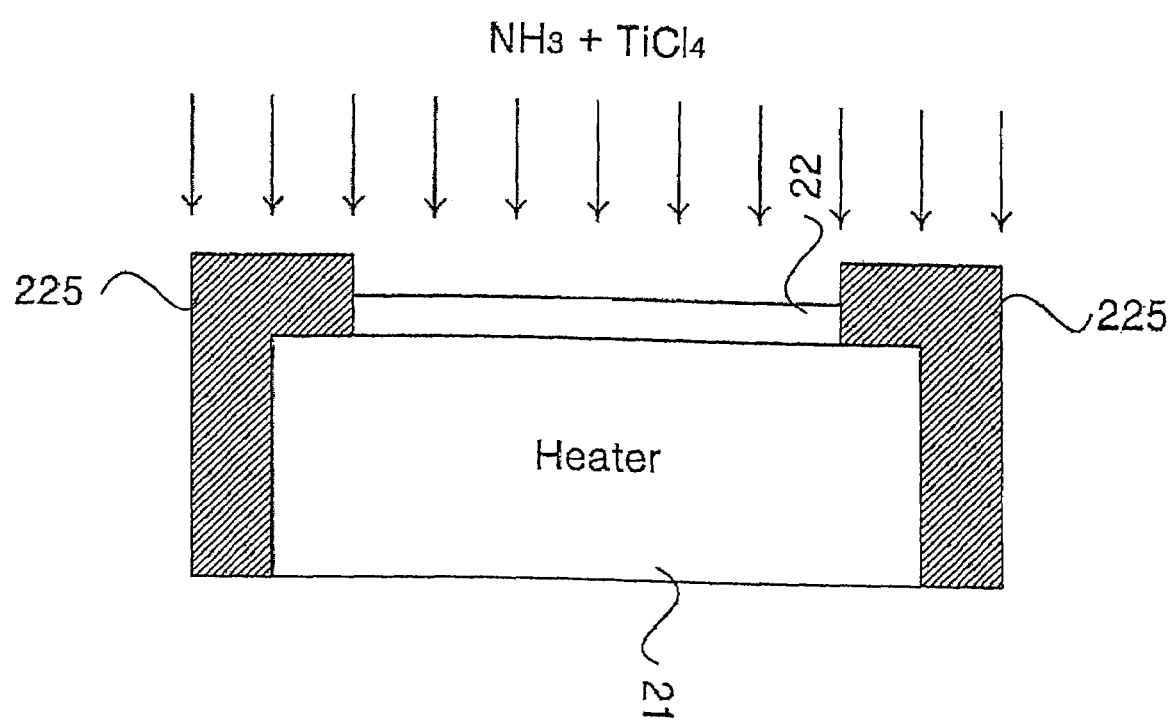
Figure 5D:
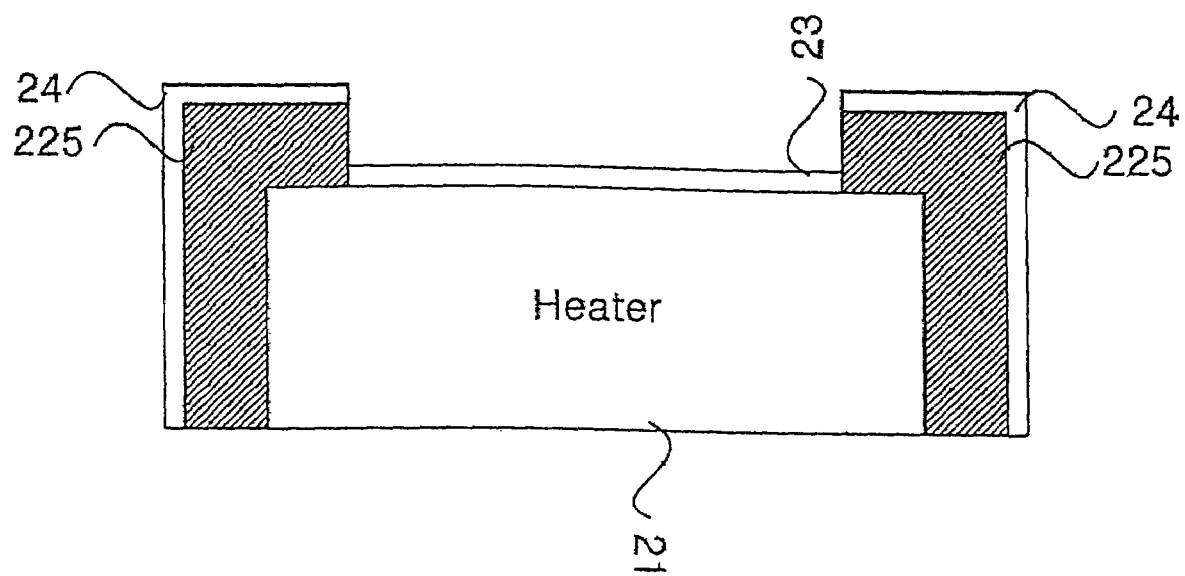

Next (step S22), as shown in FIG. 5C, the semiconductor substrate 22 is placed on the heater 21, and the TiN layer 225 is formed on the semiconductor substrate 22 by introducing $NH_3$ gas and $TiCl_4$ gas into the processing chamber. Then the semiconductor substrate 22 having the layer of TiN thereon is removed from the processing chamber. Consequently, as shown in FIG. 5D, a second by-product layer 24 is formed on the heater 21 over the TiN layer 225 whereas a first by-product layer 23 is formed on the region of the heater 21 that had been occupied by the semiconductor substrate 12.

Figure 5E:
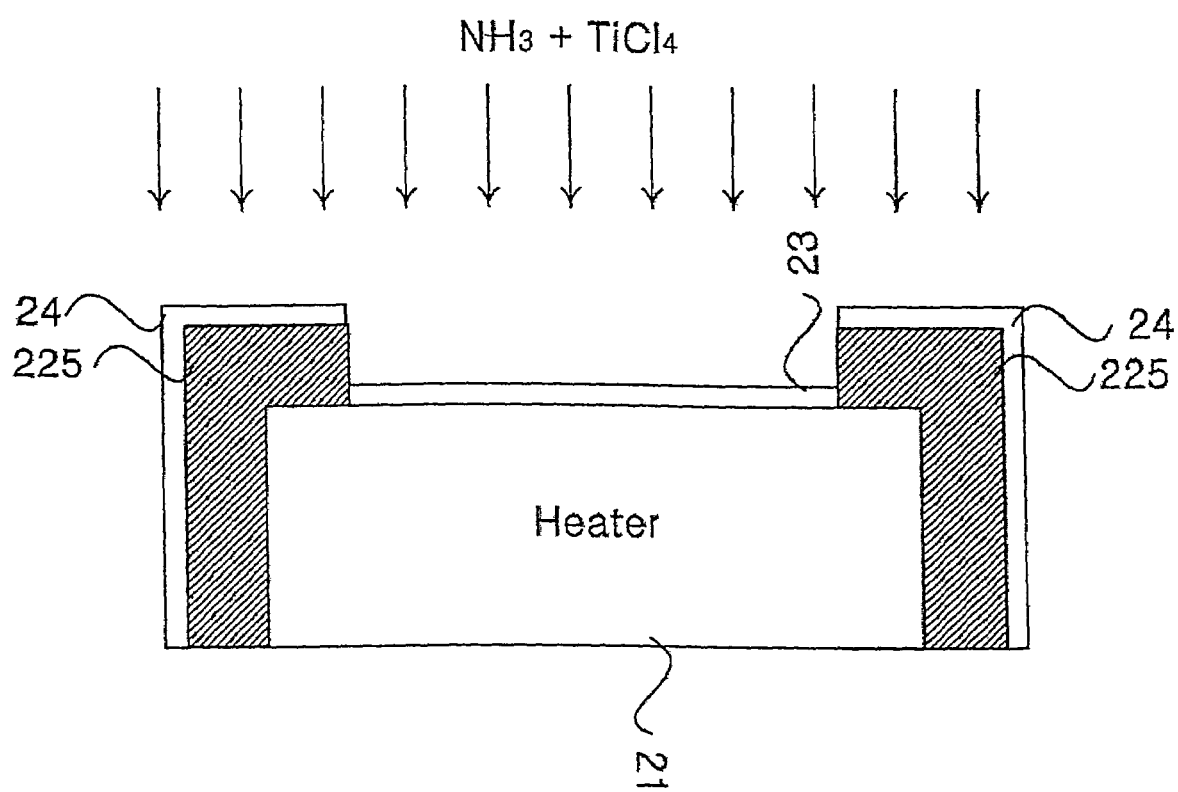
Figure 5F:
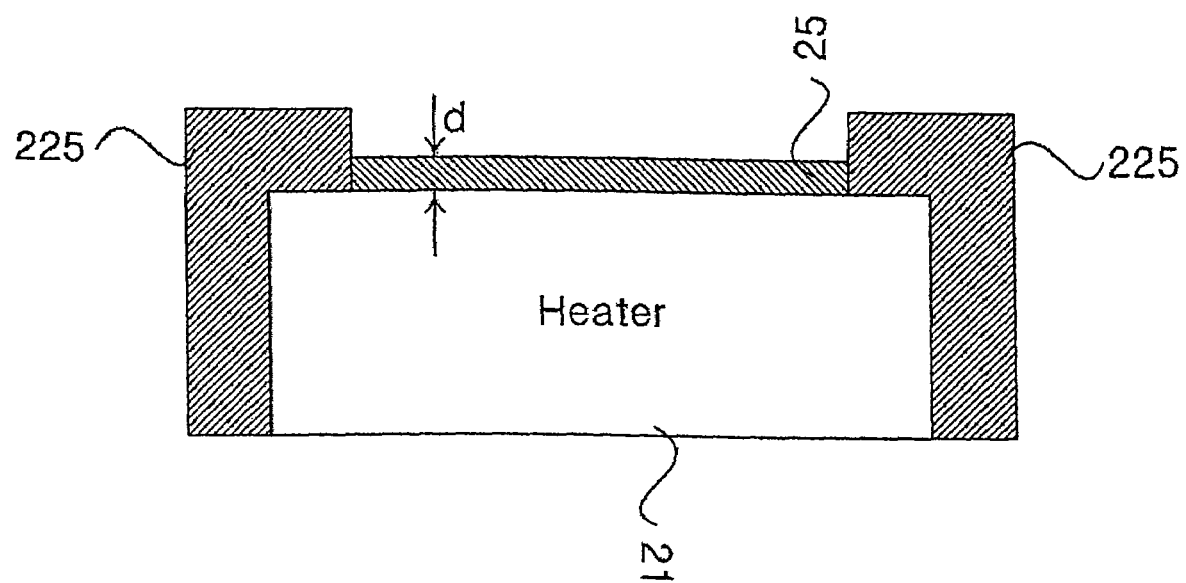

Next, as shown in FIG. 5E, $NH_3$ gas and $TiCl_4$ gas are introduced onto the entirety of the exposed surfaces of the first and second by-product layers 23 and 24 (step S23). As explained above in connection with the first embodiment, the $TiCl_4$ gas reacts with the first and second by-product layers 23 and 24, whereby the first and second by-product layers 23 and 24 are removed. Also, as shown in FIG. 5F, a TiN layer 25, 225 is subsequently formed over the entire surface of the heater 21. Such a TiN layer 25, 225 is preferably formed on the heater 21 (step S23) after each time a TiN layer 25 is formed (step S22) on a semiconductor substrate 22.

Preferably, the $NH_3$ gas is introduced onto the exposed surfaces of the by-product layers 23, 24 before the $TiCl_4$ gas. That is to say, the $TiCl_4$ gas is preferably introduced earlier than the $NH_3$ gas by a time interval sufficient for the $TiCl_4$ gas to react with the first and/or second by-product layer 23, 24 and form a gaseous reactant, e.g., $HfCl_4$.

The TiN layer 25 formed on the region of the heater 21 previously occupied by the semiconductor substrate 22 preferably has a thickness d in a range of about 5 to 20 Å. Next, the TiN layer 25 is removed from the heater (step S25).

Figure 5G:
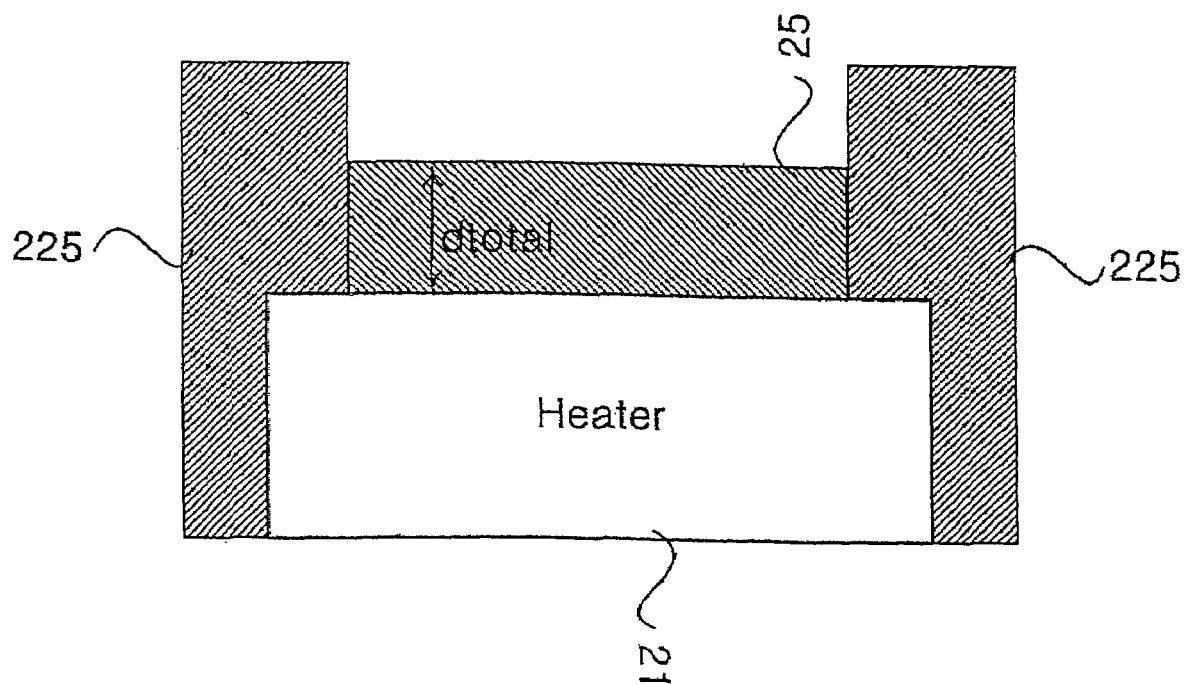

More specifically, the TiN layers 25 and 225 accumulate on the surface of the heater 21 after steps S22 and S23 are performed a number of times, i.e., after a number of substrates have been processed, as shown in FIG. 5G. If a TiN layer 25 is formed on a semiconductor substrate 22 in a state in which the thickness (dtotal) of the TiN layer 25 on the region of the heater 21 occupied by the semiconductor substrate 22 is greater than or equal to 7000 Å, characteristics of the TiN layer 25 formed on the semiconductor substrate 22 may be adversely affected. Specifically, the resistivity of the TiN layer 25 may differ from the desired resistivity. Therefore, the TiN layers 25 and 225 are preferably removed from the heater 21 once the thickness of the TiN layer 25 reaches at least 7000 Å.

Figure 5H:
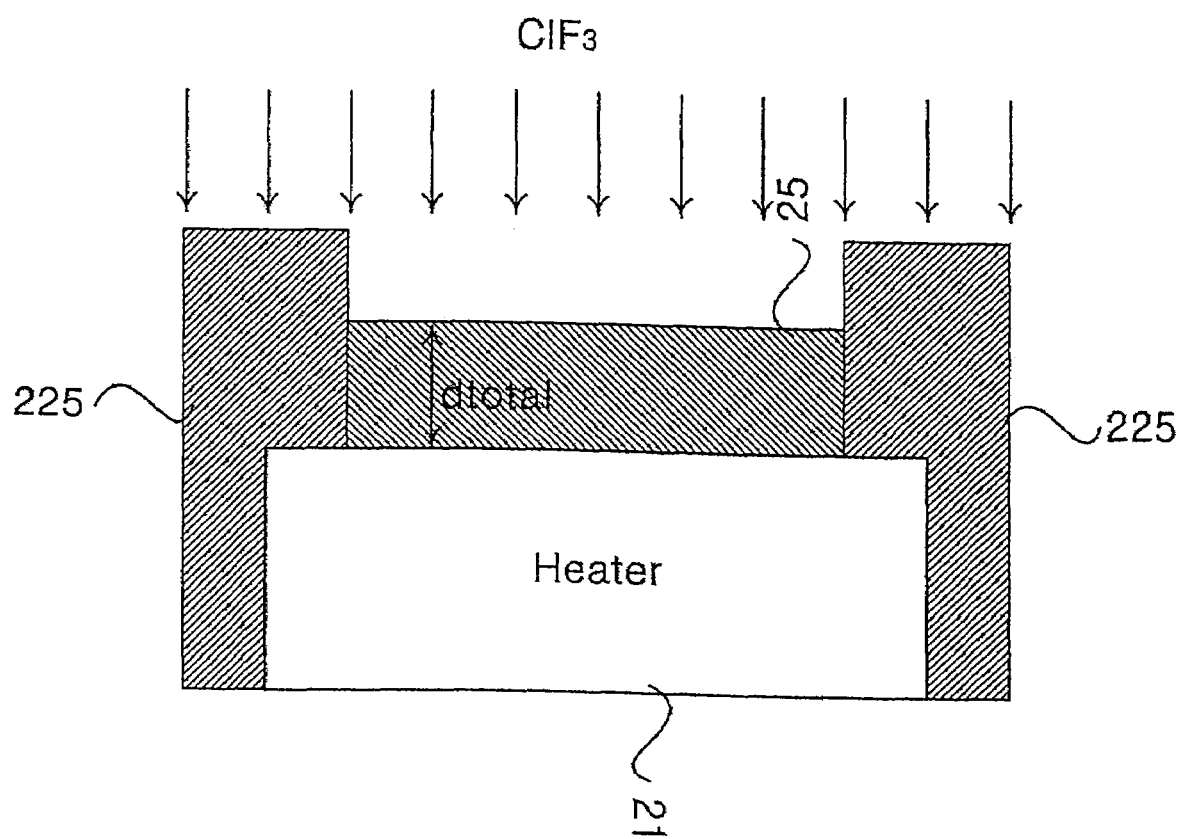
Figure 5I:
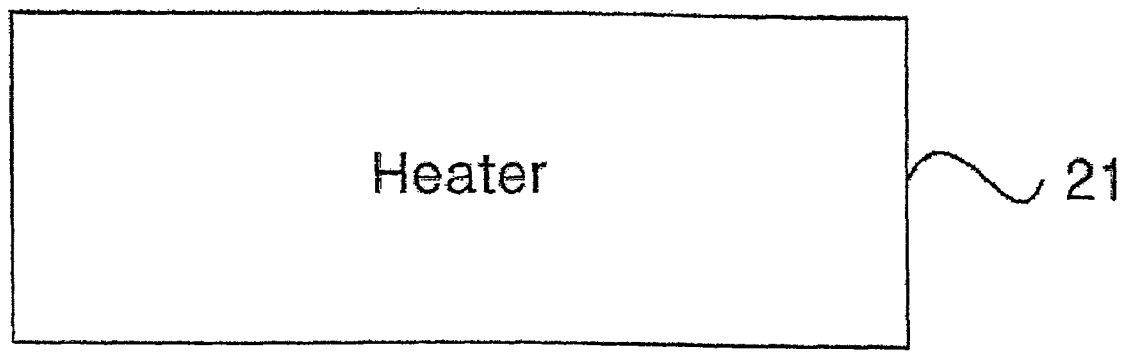

The TiN layers 25 and 225 can be removed by introducing a $ClF_3$ gas into the processing chamber of the semiconductor fabrication apparatus with the heater 21 heated to about 300° C., as shown in FIG. 5H. The $ClF_3$ gas reacts with TiN, thus forming $TiF_4$, whereby the TiN layers 25 and 225 are removed from the entire surface of the heater 21, as shown in FIG. 5I.

As described above, according to a method of cleaning a semiconductor device fabrication apparatus of the present invention, by-products produced in the forming of a conductive layer on a metal oxide layer having a high dielectric constant can be removed without opening up the (processing chamber of) the semiconductor device fabrication apparatus. Thus, semiconductor devices can be fabricated with a high degree of efficiency.

Finally, although the present invention has been particularly shown and described with reference to the preferred embodiments thereof, it will be understood by those of ordinary skill in the art that the present invention may be embodied in many other specific forms without departing from the true spirit and scope of the invention as defined by the appended claims.

What is claimed is:

1. A method for use in the fabrication of a semiconductor device, the method comprising:
    (a) providing a semiconductor substrate having a metal oxide layer of Hf oxide or Zr oxide;
    (b) transferring the substrate into a processing chamber of a semiconductor device fabrication apparatus and situating the semiconductor substrate on a dedicated region of a heater in the processing chamber of the apparatus;
    (c) subsequently forming a conductive layer of TiN on the metal oxide layer by introducing source gases of $NH_3$ and $TiCl_4$ into the processing chamber;
    (d) transferring the substrate out of the processing chamber after the conductive layer has been formed thereon; and
    (e) subsequently evaporating by-products off of the heater by heating said heater and introducing an additional supply of the $TiCl_4$ into the processing chamber.

2. The method of claim 1, wherein said (a) providing of a semiconductor substrate having a metal oxide layer comprises providing a semiconductor substrate having an Hf oxide, said (c) forming of the layer of TiN creates by-products of HfN on the heater, and said (e) evaporating of by-products off of the heater comprises removing the HfN from the heater.

3. The method of claim 1, wherein said (a) providing of a semiconductor substrate having a metal oxide layer comprises providing a semiconductor substrate having an Zr oxide, said (c) forming of the layer of TiN creates by-products of ZrN on the heater, and said (e) evaporating of by-products off of the heater comprises removing the ZfN from the heater.

4. The method of claim 1, wherein said (a) providing of a semiconductor substrate having a metal oxide layer comprises providing a semiconductor substrate having a Zr oxide, whereby by-products comprising Zr are produced on the heater.

5. The method of claim 1, wherein the source gases are introduced into the processing chamber before the substrate is transferred into the processing chamber.

6. The method of claim 5, and further comprising situating a dummy substrate on the dedicated region of the heater when the source gases are introduced into the processing chamber, wherein a TiN layer as a product of the reaction of the source gases adheres to regions of the heater other than said dedicated region.

7. The method of claim 1, and further comprising (g) subsequently introducing an additional supply of the $NH_3$ and $TiCl_4$ into the processing chamber after the by-products have been evaporated from the heater using the TiCl$_4$ and while the dedicated region of the heater is unoccupied, whereby a layer of TiN is formed on the dedicated region of the heater.

8. The method of claim 7, and further comprising removing the layer of TiN from the dedicated region of the heater when the thickness thereof exceeds 7000 Å.

9. The method of claim 1, wherein said (a) providing of a semiconductor substrate having a metal oxide layer comprises providing a semiconductor substrate having an Hf oxide, whereby by-products comprising Hf are produced on the heater.

10. The method of claim 9, wherein by-products of HfN and an Hf oxide have been produced on the heater at the time the substrate is located outside the processing chamber by said (d) transferring of the substrate, and said (e) evaporating of by-products off of the heater comprises removing both the HfN and the Hf oxide from the heater.

11. The method of claim 10, wherein by-products of ZrN and a Zr oxide have been produced on the heater at the time the substrate is located outside the processing chamber by said (d) transferring of the substrate, and said (e) evaporating of by-products off of the heater comprises removing both the ZrN and the Zr oxide from the heater.

* * * * *